(12) United States Patent
Kim et al.

(10) Patent No.: US 11,121,066 B2
(45) Date of Patent: Sep. 14, 2021

(54) FAN-OUT SEMICONDUCTOR PACKAGE

(71) Applicant: SAMSUNG ELECTRONICS CO., LTD., Suwon-si (KR)

(72) Inventors: Da Hee Kim, Suwon-si (KR); Young Gwan Ko, Suwon-si (KR); Sung Won Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/683,424

(22) Filed: Nov. 14, 2019

(65) Prior Publication Data

US 2020/0091054 A1 Mar. 19, 2020

Related U.S. Application Data

(63) Continuation of application No. 16/035,192, filed on Jul. 13, 2018, now Pat. No. 10,522,451, which is a
(Continued)

(30) Foreign Application Priority Data

Oct. 4, 2016 (KR) .................. 10-2016-0127502

(51) Int. Cl.
*H01L 23/498* (2006.01)
*H01L 23/31* (2006.01)
(Continued)

(52) U.S. Cl.
CPC .... *H01L 23/49822* (2013.01); *H01L 23/3114* (2013.01); *H01L 23/36* (2013.01);
(Continued)

(58) Field of Classification Search
CPC .......... H01L 23/49822; H01L 23/3114; H01L 23/36; H01L 23/5389; H01L 24/09;
(Continued)

(56) References Cited

U.S. PATENT DOCUMENTS 9,330,994 B2 5/2016 Camacho et al.
2011/0291249 A1 12/2011 Chi et al.
(Continued)

FOREIGN PATENT DOCUMENTS

CN 102201382 A 9/2011
KR 10-2012-0077872 A 7/2012
(Continued)

OTHER PUBLICATIONS

Communication dated Sep. 1, 2019 by the Korean Intellectual Property Office in counterpart Korean Patent Application No. 10-2016-0127502.
(Continued)

*Primary Examiner* — Nathan W Ha
(74) *Attorney, Agent, or Firm* — Sughrue Mion, PLLC

(57) ABSTRACT

A fan-out semiconductor package includes: a first connection member having a through-hole; a semiconductor chip disposed in the through-hole of the first connection member and having an active surface having connection pads disposed thereon and an inactive surface opposing the active surface; an encapsulant encapsulating at least portions of the first connection member and the inactive surface of the semiconductor chip; a second connection member disposed on the first connection member and the active surface of the semiconductor chip; and a heat dissipation layer embedded in the encapsulant so that one surface thereof is exposed. The first connection member and the second connection member include, respectively, redistribution layers electrically connected to the connection pads of the semiconductor chip.

11 Claims, 17 Drawing Sheets

Related U.S. Application Data continuation of application No. 15/709,162, filed on Sep. 19, 2017, now Pat. No. 10,211,136.

(51) Int. Cl.
| | | |
|---|---|---|
| *H01L 23/00* | (2006.01) | |
| *H01L 23/36* | (2006.01) | |
| *H01L 23/538* | (2006.01) | |
| *H01L 23/433* | (2006.01) | |

(52) U.S. Cl.
CPC .......... *H01L 23/5389* (2013.01); *H01L 24/09* (2013.01); *H01L 24/19* (2013.01); *H01L 24/20* (2013.01); *H01L 23/3121* (2013.01); *H01L 23/3128* (2013.01); *H01L 23/4334* (2013.01); *H01L 23/49816* (2013.01); *H01L 23/49827* (2013.01); *H01L 2224/04105* (2013.01); *H01L 2224/12105* (2013.01); *H01L 2224/16225* (2013.01); *H01L 2224/32225* (2013.01); *H01L 2224/73204* (2013.01); *H01L 2225/1035* (2013.01); *H01L 2225/1041* (2013.01); *H01L 2225/1094* (2013.01); *H01L 2924/15174* (2013.01); *H01L 2924/15311* (2013.01); *H01L 2924/181* (2013.01); *H01L 2924/3511* (2013.01); *H01L 2924/37001* (2013.01)

(58) Field of Classification Search
CPC ..... H01L 24/19; H01L 24/20; H01L 23/3121; H01L 23/3128; H01L 23/4334; H01L 23/49816
See application file for complete search history.

(56) References Cited

U.S. PATENT DOCUMENTS

| | | | | |
|---|---|---|---|---|
| 2012/0112236 A1* | 5/2012 | Higuma | ................ | H01L 33/641 257/98 |
| 2012/0171814 A1 | 7/2012 | Choi et al. | | |
| 2015/0028477 A1 | 1/2015 | Jung et al. | | |
| 2015/0028498 A1 | 1/2015 | Ui et al. | | |
| 2015/0108635 A1* | 4/2015 | Liang | .................. | H01L 25/0657 257/737 |
| 2015/0187742 A1 | 7/2015 | Kwon et al. | | |
| 2015/0348912 A1* | 12/2015 | Su | ....................... | H01L 23/3677 257/666 |
| 2017/0033080 A1* | 2/2017 | Chen | .................... | H01L 23/3114 |
| 2017/0077014 A1* | 3/2017 | Gowda | ................. | H01L 24/19 |
| 2017/0092617 A1* | 3/2017 | Wu | ....................... | H01L 21/561 |
| 2017/0098640 A1* | 4/2017 | Liang | ................... | H01L 25/065 |
| 2017/0194262 A1* | 7/2017 | Hu | ...................... | H01L 23/3114 |
| 2017/0284636 A1* | 10/2017 | Dittes | .................. | H01L 25/167 |
| 2018/0068952 A1* | 3/2018 | Yi | ........................... | H01L 24/20 |
| 2018/0068957 A1* | 3/2018 | Lamorey | ................ | H01L 23/36 |
| 2018/0108542 A1* | 4/2018 | Pagaila | ................ | H01L 21/568 |

FOREIGN PATENT DOCUMENTS

| | | |
|---|---|---|
| KR | 10-2012-0077875 A | 7/2012 |
| KR | 10-2013-0132161 A | 12/2013 |
| KR | 10-2013-0132162 A | 12/2013 |
| KR | 10-2013-0132163 A | 12/2013 |
| KR | 10-2015-0014214 A | 2/2015 |

OTHER PUBLICATIONS

Taiwanese Office Action issued in corresponding Taiwanese Patent Application No. 106132707, dated Feb. 2, 2018, with English Translation.

Non Final Office Action issued in related parent U.S. Appl. No. 15/709,162, dated May 3, 2018.

Office Action issued in Korean Patent Application No. 10-2016-0127502 dated Dec. 19, 2019, with English translation.

* cited by examiner

FAN-OUT SEMICONDUCTOR PACKAGE

CROSS-REFERENCE TO RELATED APPLICATION(S)

This is a Continuation of application Ser. No. 16/035,192, filed on Jul. 13, 2018, which is a continuation of U.S. application Ser. No. 15/709,162, filed on Sep. 19, 2017, which issued as U.S. Pat. No. 10,211,136 on Feb. 19, 2019, which claims benefit of priority to Korean Patent Application No. 10-2016-0127502, filed on Oct. 4, 2016 in the Korean Intellectual Property Office, the disclosure of which are incorporated herein by reference in their entirety.

TECHNICAL FIELD

The present disclosure relates to a semiconductor package, and, more particularly, to a fan-out semiconductor package in which connection terminals may extend outwardly of a region in which a semiconductor chip is disposed.

BACKGROUND

Recently, a significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of package technology suggested to satisfy the technical demand described above is a fan-cut semiconductor package. Such a fan-out semiconductor package has a compact size and may allow a plurality of pins to be implemented by redistributing connection terminals outwardly of a region in which a semiconductor chip is disposed.

SUMMARY

An aspect of the present disclosure may provide a fan-out semiconductor package in which heat dissipation characteristics are excellent and a decrease in a yield of a semiconductor chip is suppressed.

According to an aspect of the present disclosure, a fan-out semiconductor package may be provided, in which a heat dissipation layer, separately manufactured and having excellent neat dissipation characteristics, is embedded in an encapsulant encapsulating a semiconductor chip.

According to an aspect of the present disclosure, a fan-out semiconductor package may include: a first connection member having a through-hole; a semiconductor chip disposed in the through-hole of the first connection member and having an active surface having connection pads disposed thereon and an inactive surface opposing the active surface; an encapsulant encapsulating at least portions of the first connection member and the inactive surface of the semiconductor chip; a second connection member disposed on the first connection member and the active surface of the semiconductor chip; and a heat dissipation layer embedded in the encapsulant so that one surface thereof is exposed. The first connection member and the second connection member may include, respectively, redistribution layers electrically connected to the connection pads of the semiconductor chip. The heat dissipation layer may have a thickness greater than that of the redistribution layer of the first connection member and the redistribution layer of the second connection member. The encapsulant may have thermal conductivity greater than that of an insulating layer of the second connection member.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not always refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure.

In this case, singular forms include plural forms unless necessarily interpreted otherwise, in context.

Electronic Device

Figure 1:
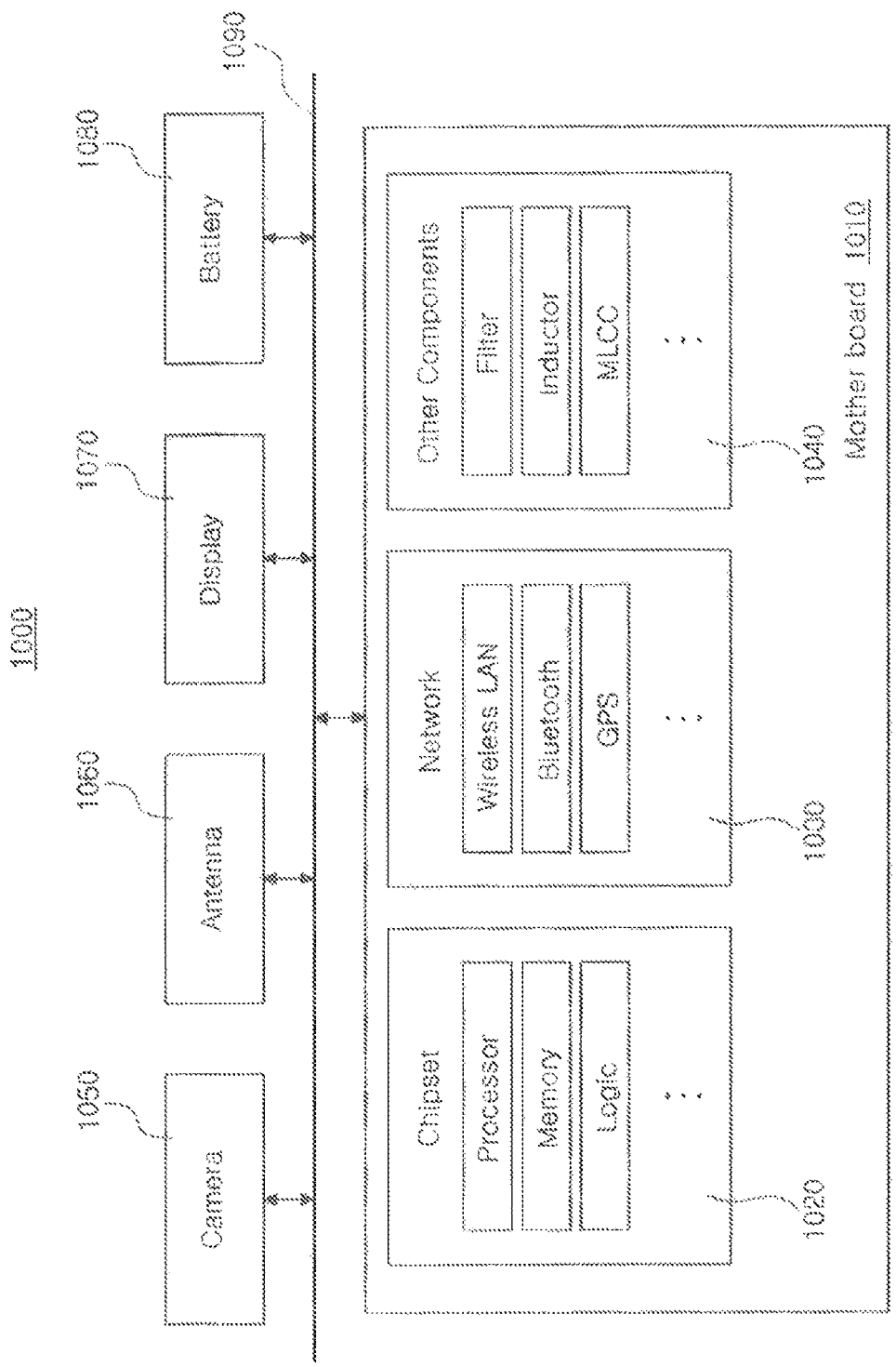
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mother board 1010 therein. The mother board 1010 may include chip related components 1020, network related components 1030, other components 1040, and the like, physically or electrically connected thereto. These components may be connected to others, to be described below, to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LIE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated since the designation of the above-mentioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
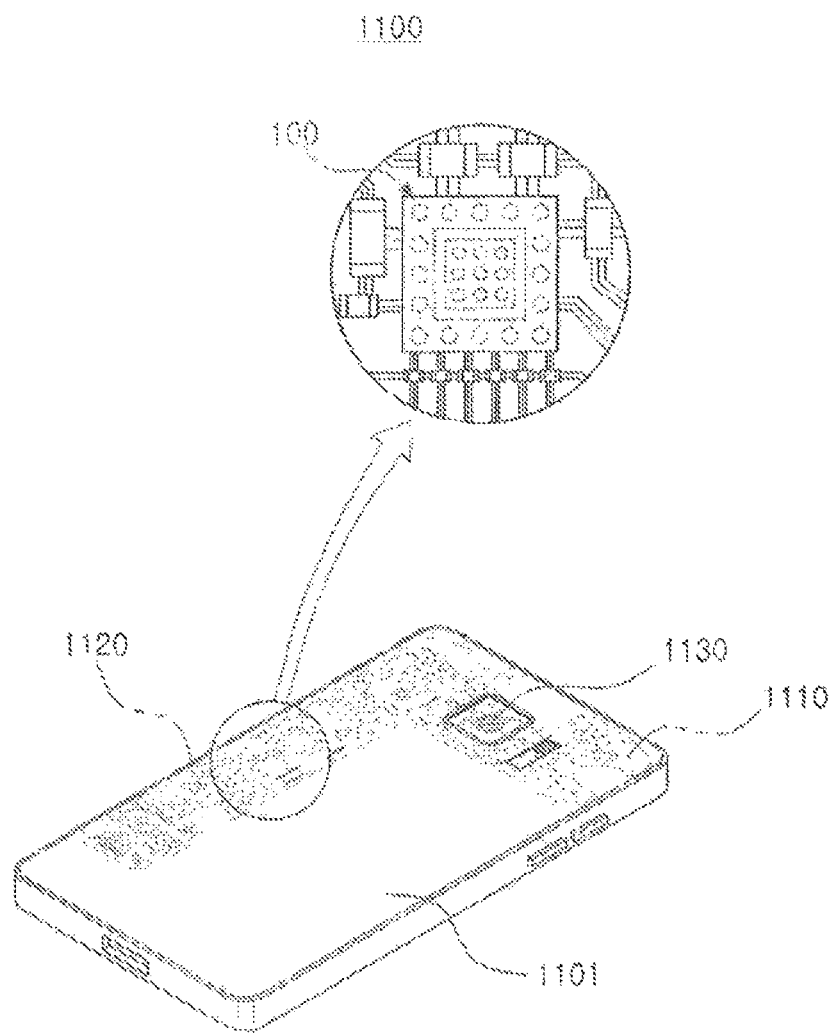
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device, in terms of electrical connections. Specifically, a size of connection pads of the semiconductor chip and an interval between the connection pads of the semiconductor chip may be very fine, but a size of component mounting pads of the main board used in the electronic device and an interval between the component mounting pads of the main board may be significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package, depending on a structure and a purpose thereof.

The fan-in semiconductor package and the fan-out semiconductor package will hereinafter be described in more detail, with reference to the drawings.

(Fan-In Semiconductor Package)

Figures 3A, 3B:
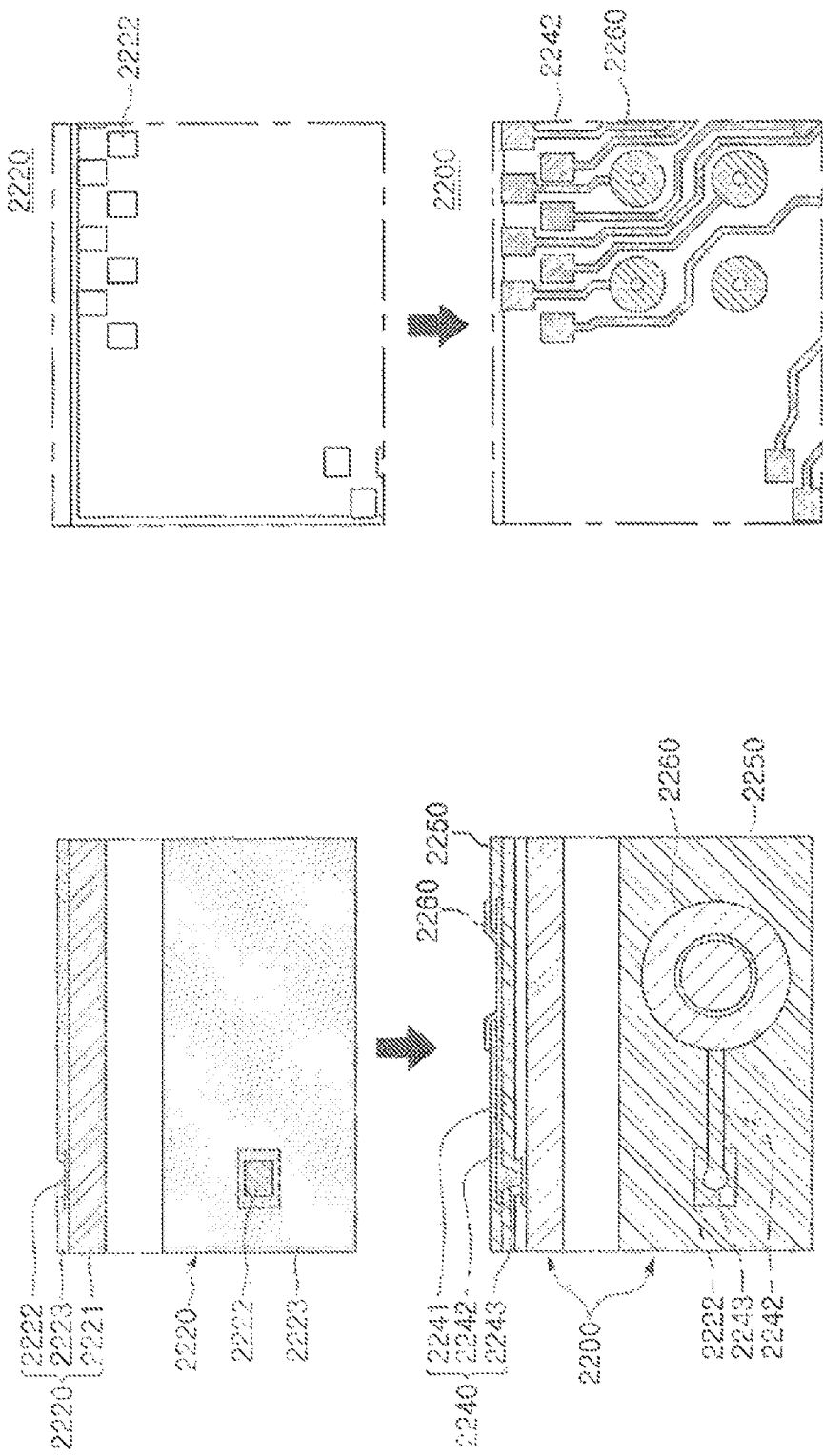
FIGS. 3A and 3B are schematic cross-sectional views illustrating states of a fan-in semiconductor package before and after being packaged.

FIGS. 3A and 3B are schematic cross-sectional views illustrating states of a fan-in semiconductor package before and after being packaged.

Figure 4:
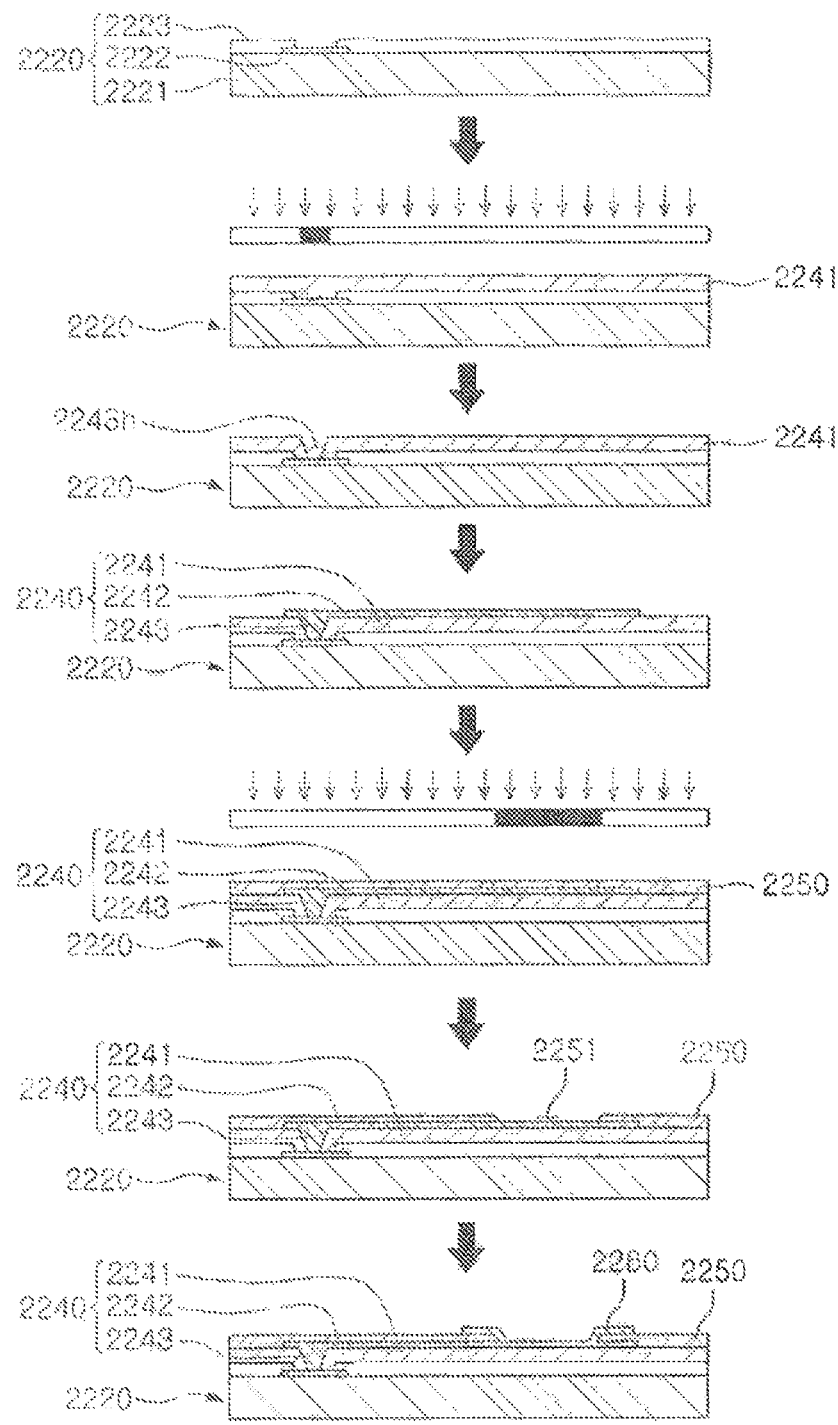
FIG. 4 is a number of schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2252 may be formed, and an under bump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. Specifically, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be mounted directly and used on the main board of the electronic device. This is due to the fact that, even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to mount the fan-in semiconductor package directly on the main board of the electronic device.

Figure 5:
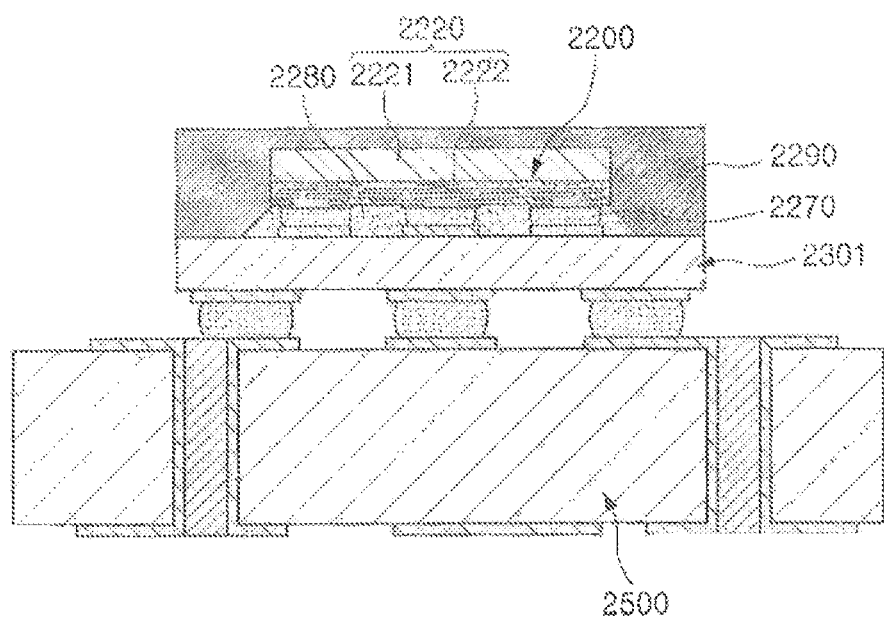
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
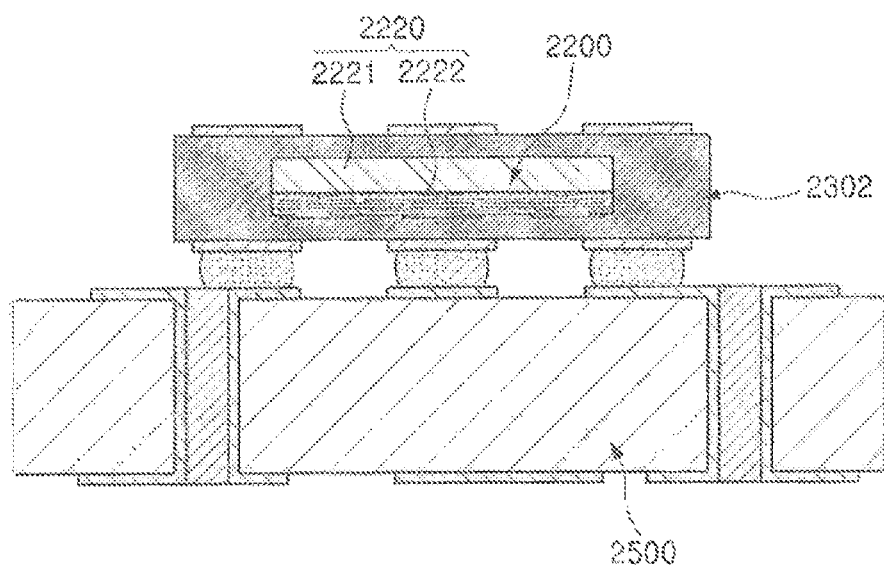
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to mount and use the fan-in semiconductor package directly on the main board of the electronic device. Therefore, the fan-in semiconductor package may be mounted on the separate interposer substrate and then be mounted on the main board of the electronic device through a packaging process or may be mounted and used on the main board of the electronic device in a state in which it is embedded in the interposer substrate.

(Fan-Out Semiconductor Package)

Figure 7:
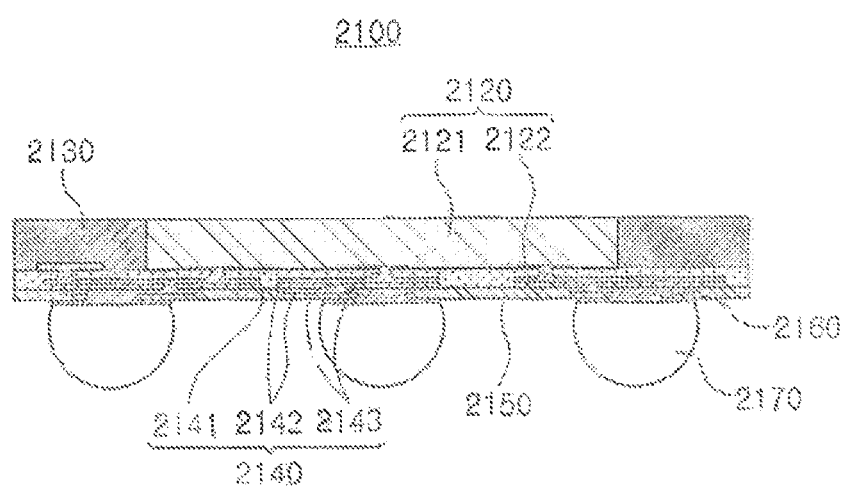
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, an outer side of a semiconductor chip 2120, for example, may be protected by an encapsulant 2130, and connection pads 2122 of the semiconductor chip 2120 may be redistributed outwardly of the semiconductor chip 2120 by a connection member 2140. In this case, a passivation layer 2150 may then be formed on the connection member 2140, and an underbump metal layer 2160 may be subsequently formed in openings of the passivation layer 2150. Solder balls 2170 may then be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package may have the form in which the I/O terminals of the semiconductor chip are redistributed and disposed outwardly of the semiconductor chip through the connection member formed on the semiconductor chip, as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
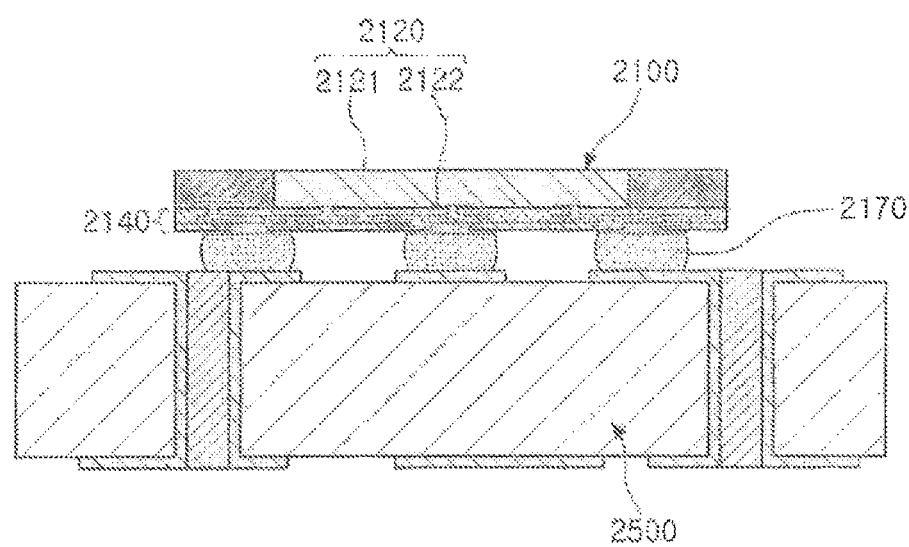
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semi conductor package may be mounted on the main board of the electronic device without using the separate interposer substrate, the fan-out semiconductor package may be implemented at a thickness less than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to an occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package in which a decrease in a yield of a semiconductor chip may be significantly suppressed will be hereinafter described with reference to the drawings.

Figure 9:
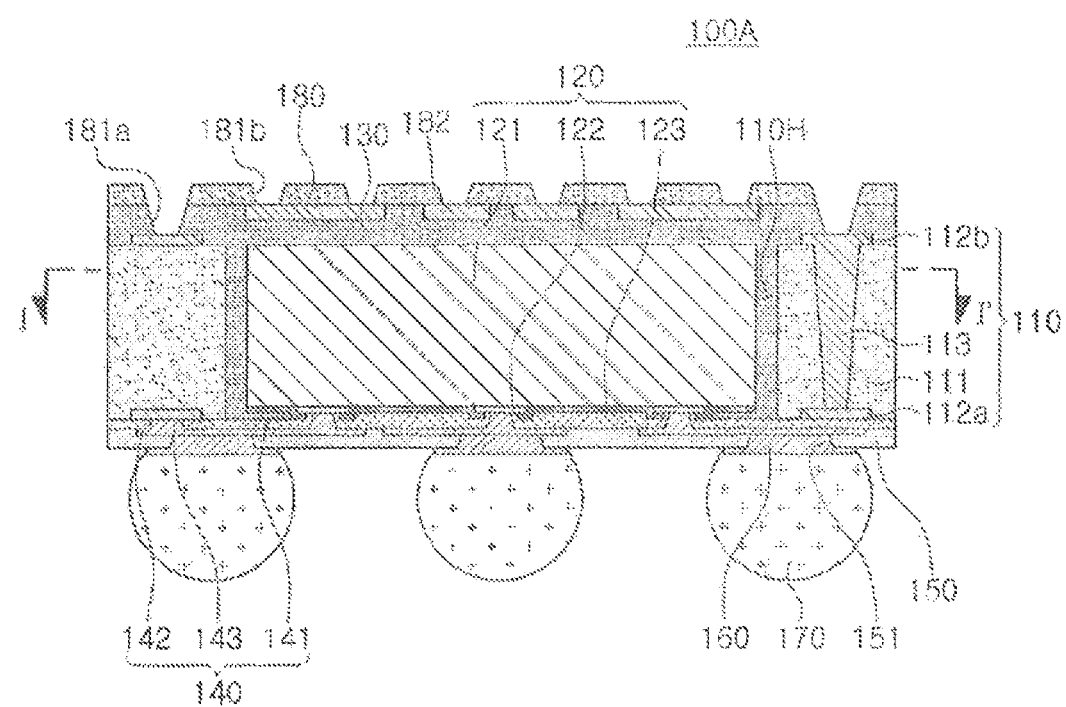
FIG. 9 is a schematic cross-sectional view illustrating an example of a fan-out semiconductor package.

FIG. 9 is a schematic cross-sectional view illustrating an example of a fan-out semiconductor package.

Figure 10:
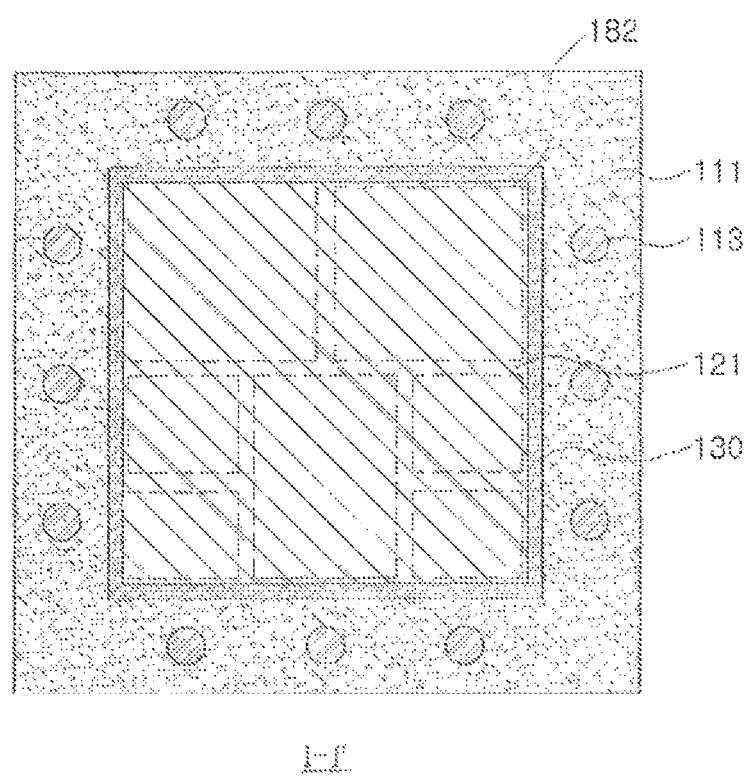
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a first connection member 110 having a through-hole 110H, a semiconductor chip 120 disposed in the through-hole 110H of the first, connection member 110 and having an active surface having connection pads 122 disposed thereon and an inactive surface opposing the active surface, an encapsulant 130 encapsulating at least portions of the first connection member 110 and the inactive surface of the semiconductor chip 120, a second connection member 140 disposed on the first connection member 110 and the active surface of the semiconductor chip 120, and a heat dissipation layer 162 embedded in the encapsulant 130, so that one surface thereof is exposed. The first connection member 110 may include redistribution layers 112a and 112b electrically connected to the connection pads 122 of the semiconductor chip 120. The second connection member 140 may also include a redistribution layer 142 electrically connected to the connection pads 122 of the semiconductor chip 120. The heat dissipation layer 182 may have a thickness greater than the thicknesses of the redistribution layers 112a and 112b of the first connection member 110 and of the redistribution layer 142 of the second connection member 140.

Recently, in accordance with the improvement of the function of a semiconductor chip, it has become important to effectively dissipate heat generated from the semiconductor chip. For this purpose, in the related art heat dissipation has been promoted by a method of attaching a heat dissipation member such as a metal plate or plating a metal layer to a semiconductor package. However, in this case, a distance between the heat dissipation member and the semiconductor chip is significant, and it is thus difficult to accomplish a sufficient heat dissipation effect. In addition, this problem occurs since the heat dissipation member is formed on a semiconductor package that is already manufactured. Therefore, when a defect occurs in a process of forming the heat dissipation member, the semiconductor chip also needs to be discarded, such that a yield of the semiconductor chip may be decreased. Further, a manufacturing process is also somewhat complicated.

On the other hand, in the fan-out semiconductor package 100A according to the exemplary embodiment, the heat dissipation layer 182 may be embedded in the encapsulant 130, such that a distance between the inactive surface of the semiconductor chip 120 and the heat dissipation layer 182 is short, resulting in a sufficient heat dissipation effect. In particular, the heat dissipation layer 182 may include a metal having excellent heat dissipation ability, such as copper (Cu). In this case, the heat dissipation layer 182 may have a thickness greater than thicknesses of circuits of the redistribution layers 112a, 112b, and 142, or the like, to have an excellent heat dissipation effect. Meanwhile, the heat dissipation layer 182 does not have a wiring form as in a circuit, but may have a post form. For example, the heat dissipation layer 182 may have large and small plane shapes, but is not limited thereto. Meanwhile, such a heat dissipation layer 182 may also be effective in controlling warpage, to thus improve structural stability of the fan-out semiconductor package.

In addition, the fan-out semiconductor package 190A according to the exemplary embodiment may include a resin layer 180 disposed on the encapsulant 130 and covering at least portions of the exposed one surface of the heat dissipation layer 182. The heat dissipation layer 182 may be formed by a separate process through the resin layer 180, and the heat dissipation layer 182 may be introduced in a manner of selectively adopting only sound heat dissipation layers, excluding defective heat dissipation layers among manufactured heat dissipation layers 162, and embedding the adopted sound heat dissipation layers in the encapsulant 130 encapsulating the semiconductor chip 120, such that a decrease in a yield of the semiconductor chip 120 may be significantly suppressed. Therefore, a cost required for manufacturing the fan-out semiconductor package 100A may be significantly reduced, and a time required for manufacturing the fan-out semiconductor package 100A may also be significantly reduced. Meanwhile, openings 181b, opening at least portions of the exposed one surface of the heat dissipation layer 182, may be formed in the resin layer 180. The heat dissipation layer 182 may be opened through the openings 181b, such that a beat dissipation effect may be excellent, in spite of the existence of the resin layer 180.

In addition, in the fan-out semiconductor package 100A according to the exemplary embodiment, a material having high thermal conductivity may be used as a material of the encapsulant 130. For example, when the encapsulant 130 having thermal conductivity of 30 W/m·K or more is used together with the heat dissipation layer 182 including metal such as copper (Cu), heat dissipation characteristics may be particularly excellent. Thermal conductivity of the encapsulant 130 may be greater than that of an insulating layer 141 of the second connection member 140. In this case, heat generated from the semiconductor chip 120 may be effectively transferred to the heat dissipation layer 182 through the encapsulant 130. In order to reduce the thermal conductivity, the encapsulant 130 may include an insulating resin and an inorganic filler, and be formed of a material in which a content of the inorganic filler is low. For example, each of the encapsulant 130 and the second connection member 140 may include an insulating resin and an inorganic filler. In this case, a weight percent of the inorganic filler included in the encapsulant 130 may be less than that of the inorganic filler included in the insulating layer 141 of the second connection member 140.

The respective components included in the fan-out semiconductor package 100A according to the exemplary embodiment will hereinafter be described in more detail.

The first connection member 110 may include redistribution layers 112a and 112b, redistributing the connection pads 122 of the semiconductor chip 120 to thus reduce the number of layers of the second connection member 140. If necessary, the first connection member 110 may maintain rigidity of the fan-out semiconductor package 100A, depending on certain materials, and may serve to secure uniformity of a thickness of the encapsulant 130. In addition, due to the first connection member 110, the fan-cut semiconductor package 100A according to the exemplary embodiment may be used as a portion of a POP. The first connection member 110 may have the through-hole 110H. The semiconductor chip 120 may be disposed in the through-hole 110H to be spaced apart from the first connection member 110 by a predetermined distance. Side surfaces of the semiconductor chip 120 may be surrounded by the first connection member 110. However, such a form is only an example and may be variously modified to have other forms, and the first connection member 110 may perform another function, depending on such a form.

The first connection member 110 may include an insulating layer 111 in contact with the second connection member 140, a first redistribution layer 112a in contact with the second connection member 140 and embedded in the insulating layer 111, and a second redistribution layer 112b, disposed on the other surface of the insulating layer 111 opposing one surface of the insulating layer 111 in which the first redistribution layer 112a is embedded. The first connection member 110 may include vias 113 penetrating through the insulating layer 111 and electrically connecting the first and second redistribution layers 112a and 112b to each other. The first and second redistribution layers 112a and 112b may be electrically connected to the connection pads 122. When the first redistribution layer 112a is embedded in the insulating layer 111, a step generated due to a thickness of the first redistribution layer 112a may be significantly reduced, and an insulating distance of the second connection member 140 may thus become constant. That is, a difference between a distance from the redistribution layer 142 of the second connection member 140 to a lower surface of the insulating layer 111 and a distance from the redistribution layer 142 of the second connection member 140 to the connection pad 122 may be less than a thickness of the first redistribution layer 112a. Therefore, a high density wiring design of the second connection member 140 may be easy to achieve.

A material of the insulating layer 111 is not particularly limited. For example, an insulating material may be used as the material of the insulating layer. In this case, the insulating material may be a thermosetting resin such as an epoxy resin, a thermoplastic resin such as a polyimide resin, an insulating material in which the thermosetting resin or the thermoplastic resin is impregnated with an inorganic filler or a core material such as a glass fiber (or a glass cloth or a glass fabric), for example, prepreg, Ajinomoto Build up Film (ABF), FR-4, Bismaleimide Triazine (BT), or the like. Alternatively, a photoimageable dielectric (PID) resin may also be used as the material of the insulating layer 111.

The redistribution layers 112a and 112b may serve to redistribute the connection pads 122 of the semiconductor chip 120, and a material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may perform various functions, depending on designs of their corresponding layers. For example, the redistribution layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a and 112b may include via pads, connection terminal pads, and the like.

Meanwhile, a surface treatment layer (not illustrated) may be formed on surfaces of some of the pad patterns, or the like, exposed from the second redistribution layer 112b through first openings 181a, if necessary. The surface treatment layer (not illustrated) is not particularly limited, as long as it is known in the related art, but may be formed by, for example, electrolytic gold plating, electroless gold plating, organic solderability preservative (OSP) or electroless tin plating, electroless silver plating, electroless nickel plating/ substituted gold plating, direct immersion gold (DIG) plating, hot air solder leveling (HASL), or the like. In a case in which the surface treatment layer (not illustrated) is formed, the second redistribution layer 112b may be considered to include the surface treatment layer, in the present disclosure.

The vias 113 may electrically connect the redistribution layers 112a and 112b formed on different layers from each other, resulting in an electrical path in the first connection member 110. A material of each of the vias 113 may be a conductive material. Each of the vias 113 may be completely filled with the conductive material, or the conductive material may be formed along a wall of each of the via holes. In addition, each of the vias 113 may have all of the shapes known in the related art, such as a tapered shape, a cylindrical shape, and the like. Meanwhile, when holes for the vias 113 are formed, some of the pads of the first redistribution layer 112a may serve as a stopper, and it may thus be advantageous in the via hole-formation process that each of the vias 113 have the tapered shape, of which a width of an upper surface is greater than that of a lower surface. In this case, the vias 113 may be integrated with portions of the second redistribution layer 112b.

The semiconductor chip 120 may be an integrated circuit (IC) provided in an amount of several hundreds to several millions of elements or more, integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto. The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. As a result, a phenomenon in which the encapsulant 130 bleeds into the lower surface of the connection pads 122 may be prevented, to some extent. An insulating layer (not illustrated), and the like, may also be further disposed in other required positions.

The inactive surface of the semiconductor chip 120 may be disposed on a level below an upper surface of the second redistribution layer 112b of the first connection member 110. For example, the inactive surface of the semiconductor chip 120 may be disposed on a level below an upper surface of the insulating layer 111 of the first connection member 110. A height difference between the inactive surface of the semiconductor chip 120 and the upper surface of the second redistribution layer 112b of the first connection member 110 may be 2 μm or more, for example, 5 μm or more. In this case, generation of cracks in corners of the inactive surface of the semiconductor chip 120 may be effectively prevented. In addition, a deviation of an insulating distance on the inactive surface of the semiconductor chip 120, in a case in which the encapsulant 130 is used, may be significantly reduced.

The encapsulant 130 may protect the first connection member 110 and/or the semiconductor chip 120. An encapsulation form of the encapsulant. 130 is not particularly limited, but may be a form in which the encapsulant 130 surrounds at least portions of the first connection member 110 and/or the semiconductor chip 120. For example, the encapsulant 130 may cover the first connection member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second connection member 140. Meanwhile, the encapsulant 130 may fill the through-hole 110H to thus serve as an adhesive and reduce buckling of the semiconductor chip 120, depending on the use of certain materials.

The encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material, such as an inorganic filler impregnated in the thermosetting resin and the thermoplastic resin, such as ABF, FP-4, BT, a PID resin, or the like. In addition, the known molding material such as an epoxy molding compound (EMC), or the like, may also be used. Alternatively, a material in which a thermosetting resin or a thermoplastic resin is impregnated with an inorganic filler and/or a core material such as a class fiber (or a glass cloth or a glass fabric) may also be used as the insulating material.

A material having high thermal conductivity may be used as a material of the encapsulant 130. For example, when the encapsulant 130 having thermal conductivity of 30 W/m·K or more is used together with the heat dissipation layer 182, including the metal such as the copper (Cu), heat dissipation characteristics may be particularly excellent. Thermal conductivity of the encapsulant 130 may be greater than that of an insulating layer 341 of the second connection member 148. In this case, heat generated from the semiconductor chip 120 may be effectively transferred to the heat dissipation layer 182 through the encapsulant 130. In order to reduce the thermal conductivity, the encapsulant 130 may include an insulating resin and an inorganic filler, and be formed of a material in which a content of the inorganic filler is low. For example, each of the encapsulant 130 and the second connection member 140 may include an insulating resin and an inorganic filler. In this case, a weight percent of the inorganic filler included in the encapsulant 130 may be smaller than that of the inorganic filler included in the insulating layer 141 of the second connection member 140.

Conductive particles may be included in the encapsulant 130 in order to increase the thermal conductivity, if necessary. For example, the conductive particles may be any material that may block electromagnetic waves, for example, copper (Cu), aluminum (Al), silver (Ag), tin (Sn), gold (Au), nickel (Ni), lead (Pb), titanium (Ti), a solder, or the like. However, these are only examples, and the conductive particles are not particularly limited thereto.

The second connection member 140 may be configured to redistribute the connection pads 122 of the semiconductor chip 120. Several tens to several hundreds of connection pads 122 having various functions may be redistributed by the second connection member 140, and may be physically or electrically connected to an external source through connection terminals 170, to be described below, depending on the functions. The second connection member 140 may include insulating layers 141, the redistribution layers 142 disposed on the insulating layers 141, and vias 143 penetrating through the insulating layers 141 and connecting the redistribution layers 142 to each other. In the fan-out semiconductor package 100A according to the exemplary embodiment, the second connection member 140 may include a single layer, but may also include a plurality of layers.

A material of each of the insulating layers 141 may be an insulating material. In this case, a photosensitive insulating material such as a PID resin may also be used as the insulating material. That is, the insulating layer 141 may be a photosensitive insulating layer. When the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are multiple layers, the insulating layers 141 may be integrated with each other, depending on a process whereby boundaries therebetween may not be apparent.

The redistribution layers 142 may serve to substantially redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions, depending on designs of their corresponding layers. For example, the redistribution layers 142 may include ground (GND) patterns, power (PWR) patterns, signal (S) patterns, and the like. Here, the signal (S) patterns may include various signals, such as data signals, and the like, except for the ground (GND) patterns, the power (PWR) patterns, and the like. In addition, the redistribution layers 142 may include via pads, connection terminal pads, and the like.

A surface treatment layer (not illustrated) may be formed on surfaces of some of the pad patterns, or the like, exposed from the redistribution layer 142 of the second connection member 140 through openings 151 formed in a passivation layer 150 described below, if necessary. The surface treatment layer (not illustrated) is not particularly limited, as long as it is known in the related art, but may be formed by, for example, electrolytic gold plating, electroless gold plating, organic OSP or electroless tin plating, electroless silver plating, electroless nickel plating/substituted gold plating, DIG plating, HASL, or the like. When the surface treatment layer (not illustrated) is formed, the redistribution layers 142 of the second connection member 140 may be considered to include the surface treatment layer, in the present, disclosure.

The vias 143 may electrically connect the redistribution layers 142, the connection pads 122, or the like, formed on different layers from each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may be formed along a wall of each of the vias. In addition, each of the vias 143 may have all of the shapes known in the related art, such as a tapered shape, a cylindrical shape, and the like.

Thicknesses of the redistribution layers 112a and 112b of the first connection member 110 may be greater than those of the redistribution layers 142 of the second connection member 140. Since the first connection member 110 may have a thickness greater than or equal to that of the semiconductor chip 120, the redistribution layers 112a and 112b formed in the first connection member 110 may be formed in large sizes, depending on a scale of the first connection member 110. On the other hand, the redistribution layers 142 of the second connection member 140 may be formed in sizes relatively smaller than those of the redistribution layers 112a and 112b of the first connection member 110 for thinness of the second connection member 140. Similarly, the vias 113 of the first connection member 110 may have dimensions greater than those of the redistribution layers 142 of the second connection member 140.

The passivation layer 150 may be additionally configured to protect the second connection member 140 from external physical or chemical damage. The passivation layer 150 may have openings 151, exposing at least portions of the redistribution layer 142 of the second connection member 140. The number of openings formed in the passivation layer 150 may be several tens to several thousands.

A material of the passivation layer 150 is not particularly limited as long as it is an insulating material. As a non-restrictive example, a material having an elastic modulus greater than that of the insulating layer 141 of the second connection member 140 may be used as the material of the passivation layer 150. For example, ABF that does not include a glass fiber (or a glass cloth or a glass fabric), but includes an inorganic filler and an insulating resin, or the like, may be used as the material of the passivation layer 150. When the ABF, or the like, is used as the material of the passivation layer 150, a weight percent of the inorganic filler included in the passivation layer 150 may be greater than that of the inorganic filler included in the insulating layer 141 of the second connection member 140. In this condition, reliability may be improved. When the ABF, or the like, is used as the material of the passivation layer 150, the insulating layer 141 may be a non-photosensitive insulating layer including the inorganic filler, and may be effective in improving reliability, but is not limited thereto.

An underbump metal layer 160 may be additionally configured to improve connection reliability of the connection terminals 170 and to improve board level reliability of the fan-out semiconductor package 100A. The underbump metal layer 160 may be connected to the redistribution layer 142 of the second connection member 140 opened through the openings 151 of the passivation layer 150. The underbump metal layer 160 may be formed in the openings 151 of the passivation layer 150 by the known metallization method using a known conductive material such as a metal, but is not limited thereto.

The connection terminals 170 may be additionally configured to physically or electrically, externally connect the fan-cut semiconductor package 100A. For example, the fan-out semiconductor package 100A may be mounted on the main board of the electronic device through the connection terminals 170. Each of the connection terminals 170 may foe formed of a conductive material, for example, a solder, or the like. However, this is only an example, and a material, of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, these are only examples, and the connection terminals 170 are not limited thereto.

The number, an interval, a disposition, or the like, of the connection terminals 170 is not particularly limited, and may be sufficiently modified by a person skilled in the art, depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less. When the connection terminals 170 are solder balls, the connection terminals 170 may cover side surfaces of the underbump metal layer 160 extending onto one surface of the passivation layer 150, and connection reliability may be excellent.

At least one of the connection terminals 170 may be disposed in a fan-out region. The fan-out region is a region except for a region in which the semiconductor chip 120 is disposed. That is, the fan-out semiconductor package 100A according to the exemplary embodiment may be a fan-out package. The fan-out package may have excellent reliability, as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to be thin, and may be price competitive.

The resin layer 180 may be used for separately manufacturing the heat dissipation layers 182 and introducing only a satisfactory heat dissipation layer of the separately manufactured heat dissipation layers 182 into the fan-out semiconductor package 100A. The heat dissipation layer 182 may be formed by a separate process through the resin layer 180, and the heat dissipation layer 182 may be introduced in a manner of selectively adopting only satisfactory heat dissipation layers, except for defective heat dissipation layers, among the manufactured heat dissipation layers 182, and embedding the adopted good heat dissipation layers in the encapsulant 130 encapsulating the semiconductor chip 120, such that a decrease in a yield of the semiconductor chip 120 may be significantly suppressed. Therefore, a cost required for manufacturing the fan-out semiconductor package 100A may be significantly reduced, and a time required for manufacturing the fan-out semiconductor package 100A may also be significantly reduced.

A material of the resin layer 180 may be the known insulating material such as ABF, including an inorganic filler and an insulating resin, prepreg including a glass fiber (or a glass cloth or a glass fabric), or the like. A weight percent of the inorganic filler included in the resin layer 180 may be greater than that of the inorganic filler included in the encapsulant 130. In this condition, generation of warpage of the fan-out semiconductor package 100A, due to a difference in a coefficient of thermal expansion (CTE) between the resin layer 180 and the encapsulant 130, may be significantly reduced without causing a defect such as delamination of the encapsulant 130. Meanwhile, when the resin layer 180 includes a material that is the same as or similar to that of the passivation layer 150, for example, when both the resin layer 180 and the passivation layer 150 include the ABF including the inorganic filler and the insulating resin, warpage dispersion may be controlled to more effectively control warpage of the fan-out semiconductor package 100A.

The first openings 181a may penetrate through the resin layer 180 and the encapsulant 130. The first openings 131a may open at least portions of a surface of the second redistribution layer 112b of the first connection member 110. Second openings 181b may penetrate through the resin layer 180. The second openings 181b may open at least portions of a surface of the heat dissipation layer 182. The opened surfaces of the second redistribution layer 112b of the first connection member 110 by the first openings 181a may be used as markings, pads for solder balls, surface mounted components, or the like, or as pads for a package-on-package structure, or the like.

The heat dissipation layer 182 may serve to dissipate the heat generated from the semiconductor chip 120, or the like, outwardly of the fan-out semiconductor package. In addition, the heat dissipation layer 182 may have an electromagnetic wave blocking function. The heat dissipation layer 182 may be embedded in the encapsulant 130, such that a distance between the inactive surface of the semiconductor chip 120 and the heat dissipation layer 182 is short, resulting in a sufficient heat dissipation effect. The heat dissipation layer 182 may include a metal having excellent heat dissipation ability, such as copper (Cu). In this case, the heat dissipation layer 182 may have a thickness greater than those of circuits of the redistribution layers 112a, 112d, and 142, or the like, to have an excellent heat dissipation effect. The heat dissipation layer 182 does not have a wiring form as in a circuit, but may have a post form. For example, the heat dissipation layer 182 may have large and small plane shapes, but is not limited thereto. When the heat dissipation layer 192 has the plane shapes, the heat dissipation layer 182 may have a plurality of plane shapes, as illustrated in the drawing, or may have one large plane shape. Meanwhile, such a heat dissipation layer 182 may also be effective in controlling warpage, to thus improve structural stability of the fan-out semiconductor package.

The heat dissipation layer 182 may include a seed layer 182a formed on the resin layer 180 and a conductor layer 182b formed on the seed layer 182a, as described below. Each of the seed layer 182a and the conductor layer 182b may include a known conductive material such as copper (Cu). The seed layer 182a may contact the resin layer 180. The conductor layer 182b may contact the encapsulant 130, and may be spaced apart from the resin layer 180. The seed layer 182a may serve as a seed, and a thickness of the seed layer 182a may thus be thinner than that of the conductor layer 182b. In some cases, at least one of the chemical reaction groups included in the insulating resin constituting the resin layer 180 may be self-assembled with a metal of the seed layer 182a formed on a surface of the resin layer 180. In this case, the seed layer 182a and the resin layer 180 may have excellent close adhesion therebetween.

Figure 11A:
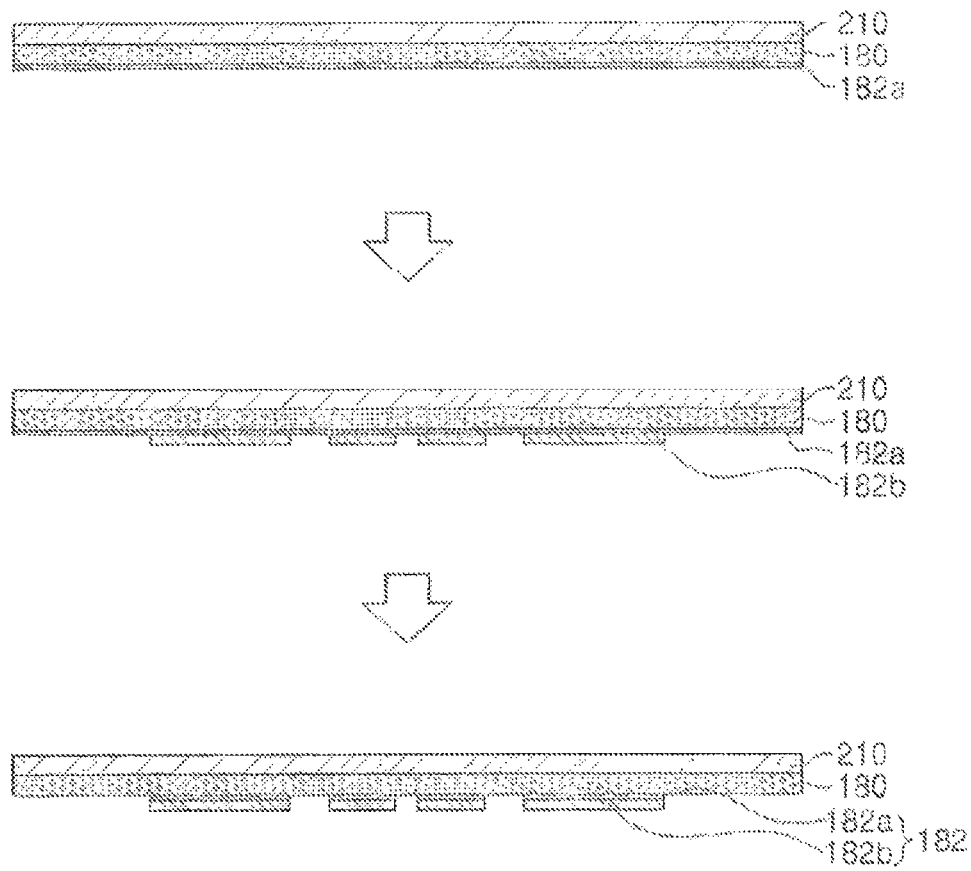
FIGS. 11A through 11C are schematic views illustrating an example of processes of manufacturing the fan-out semiconductor package of FIG. 9.
Figure 11B:
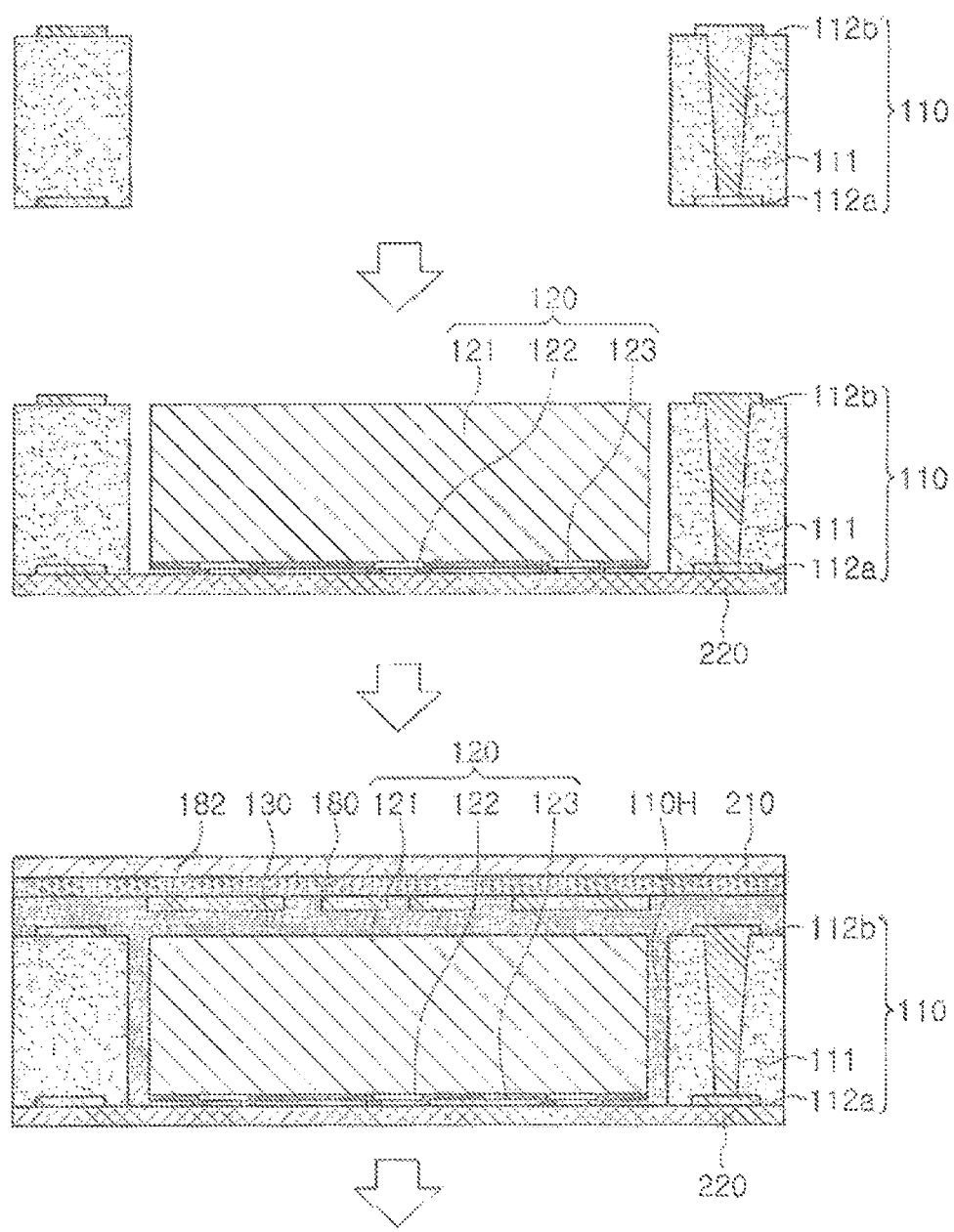
Figure 11C:
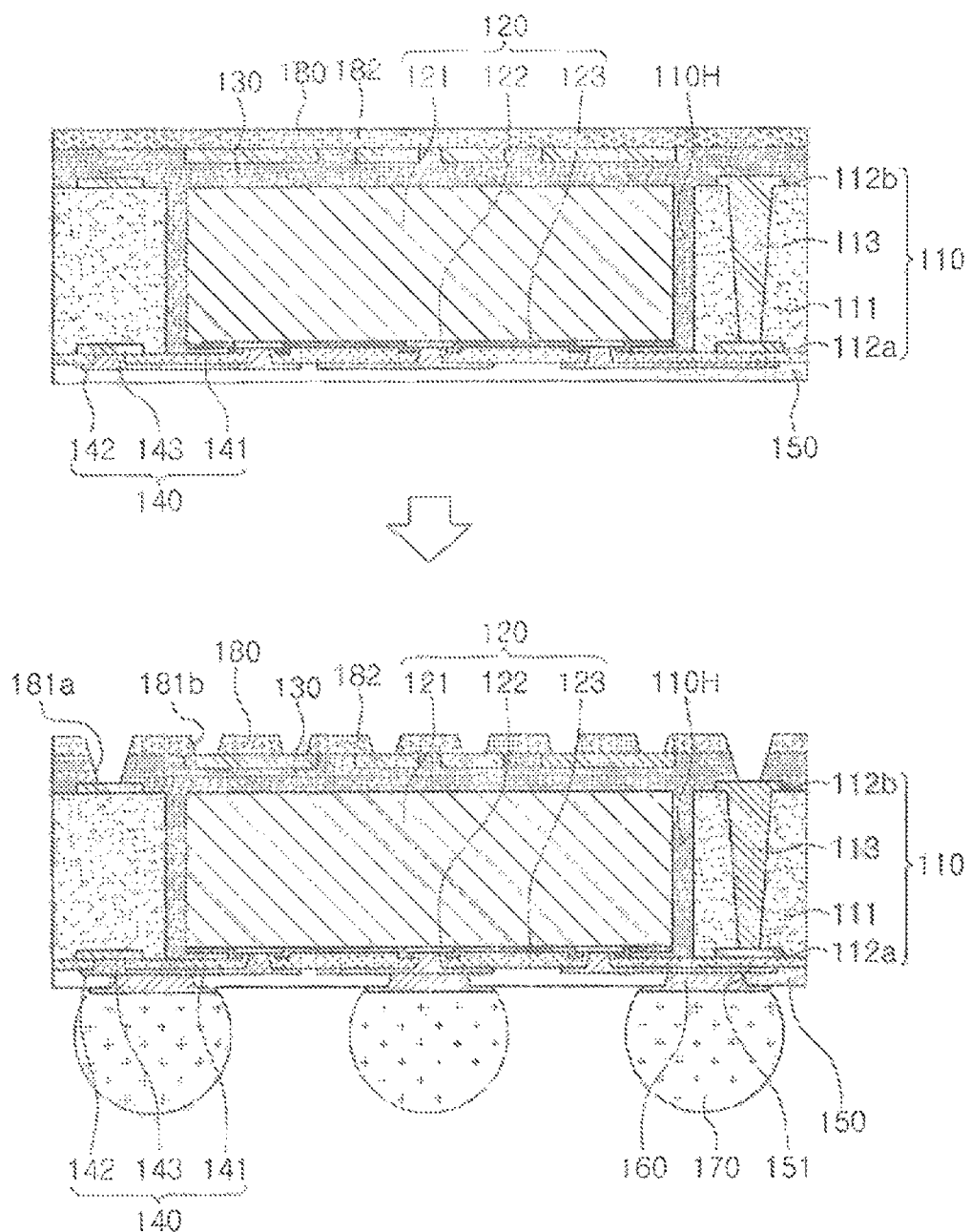

FIGS. 11A through 11C are schematic views illustrating an example of processes of manufacturing the fan-out semiconductor package of FIG. 9.

Referring to FIG. 11A, the resin layer 180 and the heat dissipation layer 182 may be formed on a detachable film 210 by separate processes. For example, the resin layer 180 may be laminated on the known detachable film 210, the seed layer 182a may be formed on the resin layer 180 by the known plating method, the patterned conductor layer 182b may be formed on the seed layer 182a, and portions of the seed layer 182a, except for patterned portions, may be removed by etching, or the like. The plating may be performed using the known method such as electroplating, electroless plating, chemical vapor deposition (CVD), physical vapor deposition (PVD), sputtering, a subtractive process, an additive process, a semi-additive process (SAP), a modified semi-additive process (MSAP), or the like. Only good heat dissipation layers 182 of manufactured heat dissipation layers may be selectively adopted.

Referring to FIG. 11B, the semiconductor chip 120 may be disposed in the through-hole 110H of the first connection member 110 using a temporary film 220 such as an adhesive film, or the like, by a separate process. For example, the first connection member 110 may be formed, the first connection member 110 may be attached to the temporary film 220, and the semiconductor chip 120 may be attached to and disposed on the temporary film 220 exposed through the through-hole 110H in a face-down form. Only a good first connection member 110 may be selectively adopted before the semiconductor chip 120 is disposed, and a yield of the semiconductor chip 120 may thus be further improved in this process. Meanwhile, the first connection member 110 may be formed by forming the first redistribution layer 112*a* on a carrier film, forming the insulating layer 111 embedding the first redistribution layer 112*a* therein, forming the vias 113 penetrating through the insulating layer 111, forming the second redistribution layer 112*b* on the insulating layer 111, and separating them from the carrier film. Then, the semiconductor chip 120 may be encapsulated using the encapsulant 130. The encapsulant 130 may encapsulate at least the first connection member 110 and the inactive surface of the semiconductor chip 120, and may fall a space within the through-hole 110H. The encapsulant 130 may be formed by a known method. For example, the encapsulant 130 may be formed by a method of laminating a precursor of the encapsulant 130 and then hardening the precursor. Alternatively, the encapsulant 130 may be formed by a method of applying a pre-encapsulant to the temporary film 220 to encapsulate the semiconductor chip 120 and then hardening the pre-encapsulant. As the method of laminating the precursor, for example, a method of performing a hot press process of pressing the precursor for a predetermined time at a high temperature, decompressing the precursor, and then cooling the precursor to room temperature, cooling the precursor in a cold press process, and then separating a work tool, or the like, may be used. As the method of applying the pre-encapsulant, for example, a screen printing method of applying ink with a squeegee, a spray printing method of applying ink in a mist form, or the like, may be used. The semiconductor chip 120 may be fixed by the hardening. Then, the detachable film 210 on which the separately manufactured heat dissipation layer 182 and the resin layer 180 are formed may be laminated on the encapsulant 130 so that the heat dissipation layer 182 is embedded in the encapsulant 130.

Referring to FIG. 11C, the detachable film 210 may be stripped. In addition, the temporary film 220 may be removed. The second connection member 140 may be formed in a region in which the temporary film 220 is stripped, using a fine semiconductor process, or the like. The second connection member 140 may be formed by forming the insulating layers 141 and then forming the redistribution layers 142 and the vias 143 in corresponding layers. The passivation layer 150 may be formed on the second connection member 140 using a lamination method, or the like, if necessary. Then, the first openings 181*a* and the second openings 181*b* may be formed. The first openings 181*a* and the second openings 181*b* may be formed using a mechanical drill, a laser drill, or the like. The first openings 181*a* and the second openings 181*b* may also be formed by a photolithography method, depending on insulating materials of the resin layer 180 and the encapsulant 130. In addition, the openings 151 may be formed by a similar method, and the underbump metal layer 160, the connection terminals 170, and the like, may be formed by a known method.

Figure 12:
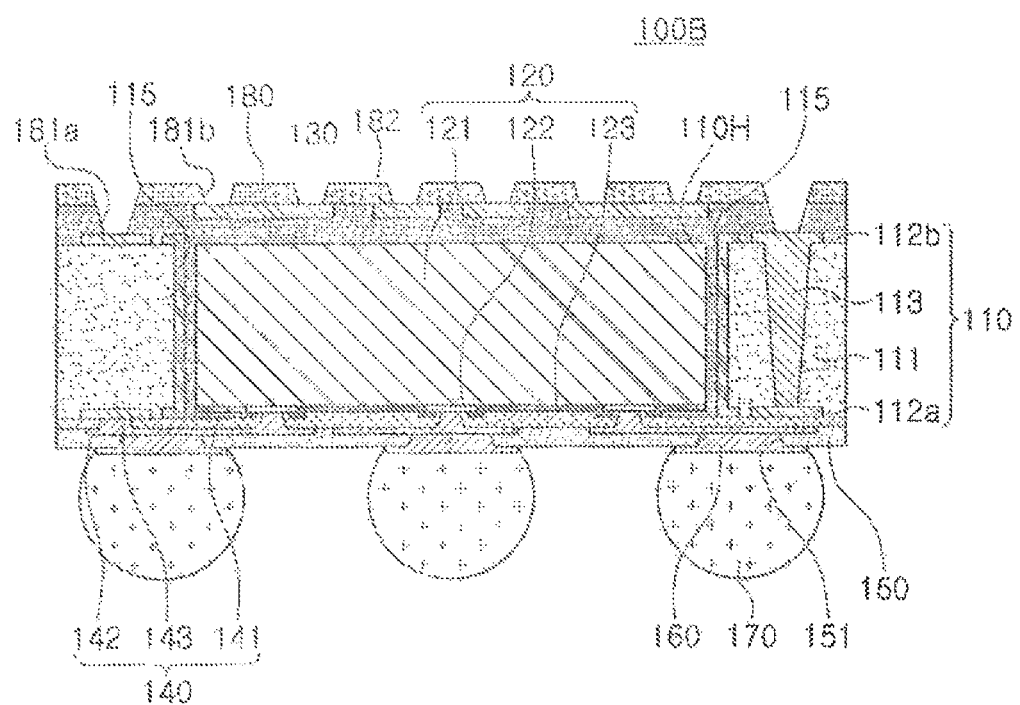
FIG. 12 is a schematic cross-sectional view illustrating another example of a fan-out semiconductor package.

FIG. 12 is a schematic cross-sectional view illustrating another example of a fan-out semiconductor package.

Referring to the drawing, a fan-out semiconductor package 100*a* according to another exemplary embodiment in the present disclosure may further include a metal layer 115 disposed on a wall of a through-hole 110H. The metal layer 115 may include a metal having excellent heat dissipation characteristics, such as copper (Cu), or the like. Heat generated from a semiconductor chip 120 may be dissipated laterally through the metal layer 115. Therefore, a heat dissipation effect may be excellent. In addition, an electromagnetic wave blocking effect may also be improved.

A description of other configurations and a manufacturing method overlapping those described above will be omitted.

Figure 13:
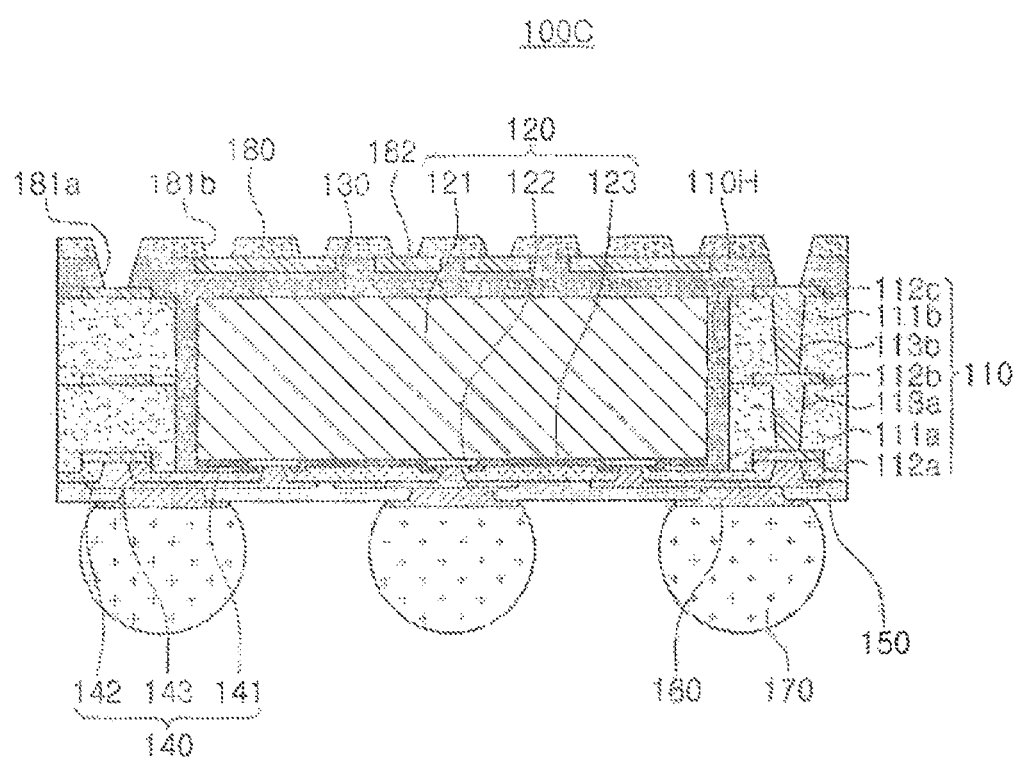
FIG. 13 is a schematic cross-sectional view illustrating another example of a fan-out semiconductor package.

FIG. 13 is a schematic cross-sectional view illustrating another example of a fan-out semiconductor package.

Referring to the drawing, in a fan-out semiconductor package 100C according to another exemplary embodiment in the present disclosure, a first connection member 110 may include a first insulating layer 111*a* in contact with a second connection member 140, a first redistribution layer 112*a* in contact with the second connection member 140 and embedded in the first insulating layer 111*a*, a second redistribution layer 112*b* disposed on the other surface of the first insulating layer 111*a*, opposing one surface of the first insulating layer 111*a* in which the first redistribution layer 112*a* is embedded, a second insulating layer 111*b* disposed on the first insulating layer 111*a* and covering the second redistribution layer 112*b*, and a third redistribution layer 112*c* disposed on the second insulating layer 111*b*. The first to third redistribution layers 112*a*, 112*b*, and 112*c* may be electrically connected to connection pads 122. The first and second redistribution layers 112*a* and 112*b* and the second and third redistribution layers 112*b* and 112*c* may be electrically connected to each other through first and second vias 113*a* and 113*b*, penetrating through the first and second insulating layers 111*a* and 111*b*, respectively.

Since the first redistribution layer 112*a* is buried in the first insulating layer 111*a*, an insulating distance of an insulating layer 141 of the second connection member 140 may be substantially constant, as described above. Since the first connection member 110 may include a large number of redistribution layers 112*a*, 112*b*, and 112*c*, the second connection member 140 may be further simplified. Therefore, a decrease in a yield depending on a defect occurring in a process of forming the second connection member 140 may be suppressed. The first redistribution layer 112*a* may be recessed in the first insulating layer 111*a*, such that a lower surface of the first insulating layer 111*a* may have a step, with respect to a lower surface of the first redistribution layer 112*a*. As a result, when an encapsulant 130 is formed, a phenomenon in which a material of the encapsulant 130 bleeds to pollute the first redistribution layer 112*a* may be prevented.

The lower surface of the first redistribution layer 112*a* of the first connection member 110 may be disposed on a level above a lower surface of the connection pad 122 of a semiconductor chip 120. In addition, a distance between the redistribution layer 142 of the second connection member 140 and the first redistribution layer 112*a* of the first connection member 110 may be greater than that between the redistribution layer 142 of the second connection member 140 and the connection pad 122 of the semiconductor chip 120. This is due to the fact that the first redistribution layer 112a may be recessed into the first insulating layer 111a. The second redistribution layer 112b of the first connection member 110 may be disposed on a level between an active surface and an inactive surface of the semiconductor chip 120. The first connection member 110 may be formed at a thickness corresponding to that of the semiconductor chip 12C. Therefore, the second redistribution layer 112b formed in the first connection member 110 may be disposed on a level between the active surface and the inactive surface of the semiconductor chip 120.

Thicknesses of the redistribution layers 112a, 112b, and 112c of the first connection member 110 may be greater than that of the redistribution layer 142 of the second connection member 14C. Since the first connection member 110 may have a thickness greater than or equal to that of the semiconductor chip 120, the redistribution layers 112a, 112b, and 112c may be formed in large sizes, depending on a scale of the first connection member 110. On the other hand, the redistribution layer 142 of the second connection member 140 may be formed in a relatively small size, for thinness.

A description of other configurations and a manufacturing method overlapping those described above will be omitted. Meanwhile, the description of the fan-cut semiconductor package 100B described above may also be applied to the fan-out semiconductor package 100C.

Figure 14:
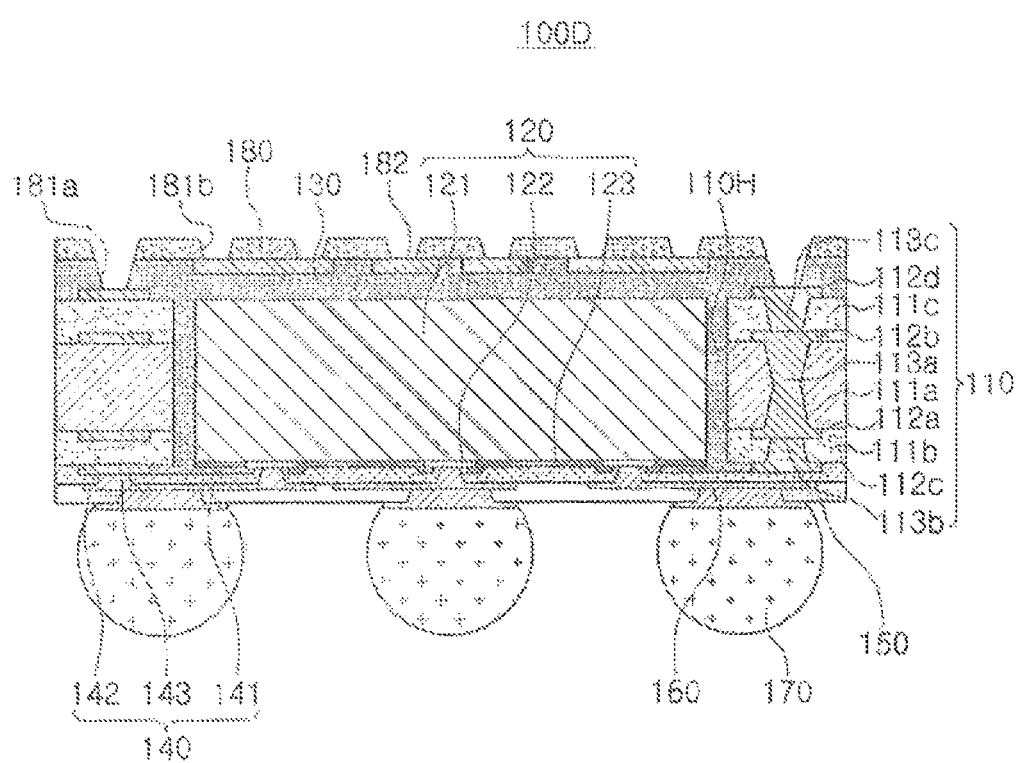
FIG. 14 is a schematic cross-sectional view illustrating another example of a fan-out semiconductor package.

FIG. 14 is a schematic cross-sectional view illustrating another example of a fan-cut semiconductor package.

Referring to the drawing, in a fan-out semiconductor package 100D according to another exemplary embodiment in the present disclosure, a first connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 312b, and a fourth redistribution layer 112d disposed on the third insulating layer 111c. The first to fourth redistribution layers 112a, 112b, 112c, and 112d may be electrically connected to connection pads 122. Since the first connection member 110 may include a larger number of redistribution layers 112a, 112b, 112c, and 112d, a second connection member 140 may be further simplified. Therefore, a decrease in yield, depending on a defect occurring in a process of forming the second connection member 140, may be suppressed. The first to fourth redistribution layers 112a, 112b, 112c, and 112d may be electrically connected to each other through first to third vias 113a, 113b, and 113c, penetrating through the first to third insulating layers 111a, 111b, and 111c, respectively.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto. Similarly, the first, via 113a may have a diameter greater than those of the second via 113b and the third via 113c.

A lower surface of the third redistribution layer 112c of the first connection member 110 may be disposed on a level below a lower surface of the connection pad 122 of a semiconductor chip 120. In addition, a distance between a redistribution layer 142 of the second connection member 140 and the third redistribution layer 112c of the first connection member 110 may be less than that between the redistribution layer 142 of the second connection member 140 and the connection pad 122 of the semiconductor chip 120. This is due to the fact that the third redistribution layer 112c may be disposed in a protruding form on the second insulating layer 111b, resulting in contact with the second connection member 140. The first redistribution layer 112a and the second redistribution layer 112b of the first, connection member 110 may be disposed on a level between an active surface and an inactive surface of the semiconductor chip 120. The first connection member 110 may be formed at a thickness corresponding to that of the semiconductor chip 120. Therefore, the first redistribution layer 112a and the second redistribution layer 112b formed in the first connection member 110 may be disposed on a level between the active surface and the inactive surface of the semiconductor chip 120.

Thicknesses of the redistribution layers 112a, 112b, 112c, and 112d of the first connection member 110 may be greater than that of the redistribution layer 142 of the second connection member 140. Since the first connection member 110 may have a thickness equal to or greater than that of the semiconductor chip 120, the redistribution layers 112a, 112b, 112c, and 112d may also be formed to have large sizes. On the other hand, the redistribution layer 142 of the second connection member 140 may be formed in a relatively small size, for thinness.

A description of other configurations and a manufacturing method overlapping those described above will be omitted. Meanwhile, the description of the fan-out semiconductor package 100B described above may also be applied to the fan-out semiconductor package 100D.

Figure 15:
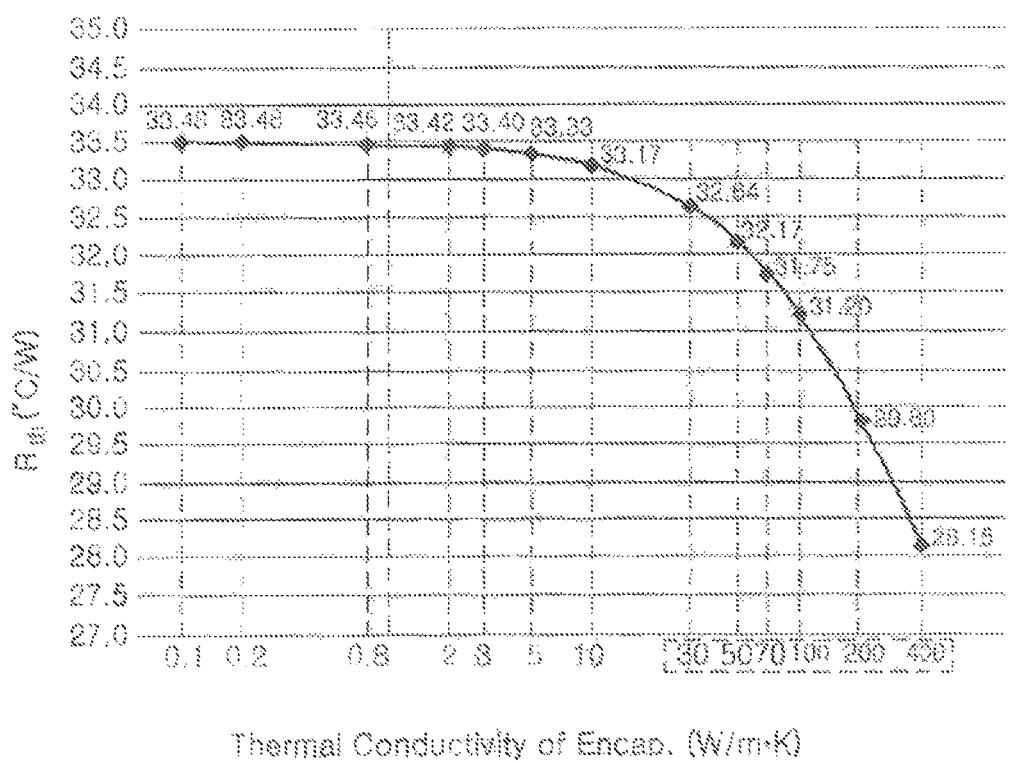
FIG. 15 is a schematic view illustrating a heat dissipation effect depending on thermal conductivity of an encapsulant.

FIG. 15 is a schematic view illustrating a heat dissipation effect depending on thermal conductivity of an encapsulant.

It may be appreciated from the drawing that when the heat dissipation layer 182 including copper (Cu) and having a thickness of 30 μm or more is introduced, and a material having thermal conductivity of 30 W/m·K or more is used as the material of the encapsulant 130, a heat radiation effect is excellent. Meanwhile, a reference of an amount of generated heat is 2 W.

As set forth above, according to the exemplary embodiments in the present disclosure, a tan-out semiconductor package in which heat dissipation characteristics are excellent and a decrease in a yield of a semiconductor chip is suppressed may be provided.

While exemplary embodiments have been shown and described above, it will be apparent to those skilled in the art that modifications and variations could be made without departing from the scope of the present invention, as defined by the appended claims.

What is claims is:
1. A semiconductor package comprising:
   a semiconductor chip having an active surface having connection pads disposed thereon and an inactive surface opposing the active surface;

an encapsulant covering at least a portion of the inactive surface of the semiconductor chip;

a connection member disposed on the active surface of the semiconductor chip and including a redistribution layer electrically connected to the connection pads of the semiconductor chip;

a conductive structure disposed above the connection member, and disposed adjacent to the semiconductor chip;

a conductive layer embedded in the encapsulant such that at least a portion of one surface of the conductive layer faces the inactive surface of the semiconductor chip, wherein the conductive layer has a thickness greater than that of the redistribution layer of the connection member, and wherein another surface of the conductive layer, opposing the one surface of the conductive layer, is exposed from the encapsulant;

a resin layer disposed on the encapsulant and covering at least first portions of the another surface of the conductive layer;

a first opening penetrating the resin layer and the encapsulant and exposing a portion of the conductive structure; and a second opening penetrating the resin layer and exposing a portion of the conductive layer.

2. The semiconductor package of claim 1, wherein the conductive layer includes at least one plane shape pattern.

3. The semiconductor package of claim 1, wherein at least a portion of the conductive structure is covered by an insulating material.

4. The semiconductor package of claim 1, wherein the resin layer has openings exposing at least second portions of the another surface of the conductive layer.

5. The semiconductor package of claim 1, wherein an upper surface of the conductive structure and the another surface of the conductive layer are disposed on different levels.

6. The semiconductor package of claim 1, wherein the encapsulant has thermal conductivity greater than that of an insulating layer of the connection member.

7. The semiconductor package of claim 6, wherein the encapsulant and the insulating layer of the connection member include insulating resins and inorganic fillers, respectively, and a weight percentage of the inorganic fillers included in the encapsulant is less than that of the inorganic fillers included in the insulating layer of the connection member.

8. The semiconductor package of claim 1, wherein the conductive layer is formed of a metal and is electrically isolated from the conductive structure.

9. A semiconductor package comprising:

a connection member including a redistribution layer;

a semiconductor chip disposed above the connection member and having an active surface having connection pads disposed thereon and an inactive surface opposing the active surface, the active surface facing the connection member;

an interconnection member disposed above the connection member, disposed adjacent to the semiconductor chip and including a conductive portion;

an encapsulant disposed above the connection member and encapsulating at least portions of the inactive surface of the semiconductor chip and the interconnection member;

a conductive layer embedded in the encapsulant such that one surface of the conductive layer is exposed; and a resin layer disposed on the encapsulant and covering at least portions of the one surface of the conductive layer, wherein a first opening penetrating the resin layer and the encapsulant exposes a portion of the conductive portion of the interconnection member, and a second opening penetrating the resin layer exposes a portion of the conductive layer.

10. The semiconductor package of claim 9, wherein an upper surface of the conductive portion of the interconnection member and the one surface of the conductive layer are disposed on different levels.

11. The semiconductor package of claim 9, wherein the conductive layer includes a first metal layer disposed on the resin layer and a second metal layer disposed on the first metal layer, and the second metal layer is thicker than the first metal layer.

* * * * *